(12) United States Patent
Tang (10) Patent No.: US 10,803,344 B2
(45) Date of Patent: Oct. 13, 2020

(54) PANEL ADSORPTION DEVICE AND AUTOMATIC ADSORPTION METHOD USING THE SAME

(71) Applicant: Wuhan China Star Optoelectronics Technology Co., Ltd., Wuhan (CN)

(72) Inventor: Yuejun Tang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 20 days.

(21) Appl. No.: 16/349,995

(22) PCT Filed: Feb. 25, 2019

(86) PCT No.: PCT/CN2019/076035
§ 371 (c)(1),
(2) Date: May 15, 2019

(87) PCT Pub. No.: WO2020/042548
PCT Pub. Date: Mar. 5, 2020

(65) Prior Publication Data
US 2020/0271965 A1     Aug. 27, 2020

(30) Foreign Application Priority Data

Aug. 28, 2018   (CN) .......................... 2018 1 0984258

(51) Int. Cl.
*G06K 9/52* (2006.01)
*G03F 1/42* (2012.01)
*G06K 9/46* (2006.01)
*G06F 16/583* (2019.01)
*G02F 1/13* (2006.01)

(52) U.S. Cl.
CPC ............ *G06K 9/52* (2013.01); *G02F 1/1303* (2013.01); *G03F 1/42* (2013.01); *G06F 16/5854* (2019.01); *G06K 9/4604* (2013.01)

(58) Field of Classification Search
CPC ... G02F 1/1309; G02F 1/1303; H04N 5/2256; H04N 5/247; G06T 7/60; G06T 7/13; G06T 7/12; G06T 7/136; G06T 2207/30121; H01K 3/305; G03F 1/42; G06K 9/4604; G06K 9/52; G06F 16/5854
USPC ........................................ 382/151, 199, 203
See application file for complete search history.

(56) References Cited

U.S. PATENT DOCUMENTS

2013/0142613 A1   6/2013   Yin et al.

FOREIGN PATENT DOCUMENTS

| CN | 102495492 | 6/2012 |
|----|-----------|--------|
| CN | 203775535 | 8/2014 |
| CN | 105457908 | 4/2016 |
| JP | 2004-029239 | 1/2004 |
| KR | 10-2004-0101769 | 12/2004 |

*Primary Examiner* — Joseph L Williams
*Assistant Examiner* — Jose M Diaz (57) ABSTRACT

Provided are a panel adsorption device and an automatic adsorption method using the same. A position of a liquid crystal panel on a platform is determined by providing a plurality of image capture devices above the platform, and then correspondingly sets the vacuum adsorption hole to a negative pressure state to firmly locate the liquid crystal panel on the platform. Meanwhile, the platform can be compatible with panels of various models and sizes.

13 Claims, 4 Drawing Sheets

PANEL ADSORPTION DEVICE AND AUTOMATIC ADSORPTION METHOD USING THE SAME

RELATED APPLICATIONS

This application is a National Phase of PCT Patent Application No. PCT/CN2019/076035 having International filing date of Feb. 25, 2019, which claims the benefit of priority of Chinese Patent Application No. 201810984258.8 filed on Aug. 28, 2018. The contents of the above applications are all incorporated by reference as if fully set forth herein in their entirety.

FIELD AND BACKGROUND OF THE INVENTION

The present invention relates to a technical field of manufacturing liquid crystal panel, and more particularly to a panel adsorption device and an automatic adsorption method using the same.

At present, liquid crystal panels have been widely used, especially small-sized liquid crystal panels. LCD manufacturers typically divide glass panels containing several small-sized LCD panels into individual panels to form the desired individual panels. These individual panels can be used for small size products, such as cell phones, PADs and etc. Therefore, LCD manufacturers can request professional foundries for panel cutting process, and then bond the circuit board, the backlight module and etc., with an adsorption bonding process to form final products. Certainly, liquid crystal manufacturers may use a similar method for large-sized liquid crystal panels.

Currently, in the process of adsorbing and fixing the liquid crystal panel to the platform, a plurality of vacuum adsorption holes are generally formed on the platform, and then the vacuum adsorption holes are set to a negative pressure, so that the liquid crystal panel can be firmly adsorbed on the platform. Then, the liquid crystal panel can be subjected to subsequent operation and process.

However, the existing platform cannot be intelligently compatible with various sizes of liquid crystal panels. In addition, in the process of adsorbing liquid crystal panels of various sizes, the vacuum adsorption holes of the regions not covered by the liquid crystal panel are also set to the negative pressure, thereby causing a certain waste of resources.

Therefore, there is a need to provide a new panel adsorption device to solve the existing problems of the prior art.

SUMMARY OF THE INVENTION

An objective of the present invention is to provide a panel adsorption device that determines a position of a liquid crystal panel on a platform by providing a plurality of image capture devices above the platform, and then correspondingly sets the vacuum adsorption hole to a negative pressure state to firmly locate the liquid crystal panel on the platform. Meanwhile, the platform can be compatible with panels of various models and sizes.

First, the present invention provides a panel adsorption device, including: a platform, including a plurality of vacuum adsorption holes, wherein the platform is used to carry a liquid crystal panel; at least one image capture device, disposed above the platform, wherein the image capture device is configured to collect an image of a liquid crystal panel on the platform; a processing device, connected to the image capture device, wherein the processing device receives an image captured by the image capture device, extracts image data, and calculates and determines a boundary range of the liquid crystal panel according to the image data; a vacuum machine, connected to the processing device, wherein the vacuum machine is configured to set a vacuum adsorption hole in the boundary range to a negative pressure state according to the boundary range of the liquid crystal panel determined by the processing device, so that the liquid crystal panel is adsorbed on the platform; at least one lighting device, installed above the platform, and used to provide a light source to the image capture device to form bright field illumination; wherein the processing device further includes: a grayscale preprocessing module, configured to perform grayscale processing on the captured image to form a grayscale image; a grayscale image threshold calculation module, connected to the grayscale preprocessing module and configured to segment the grayscale image by using a threshold, wherein a threshold of the grayscale image adopts an adaptive threshold related to an image average grayscale; a closed image forming module, connected to the grayscale image threshold calculation module, and configured to scan the grayscale image, and to determine all boundary points, and to connect the boundary points into a closed figure; a boundary line segment selection module, connected to the closed image forming module, and configured to extract a longer line segment in the closed figure; and a geometric image boundary determination module, connected to the boundary line segment selection module, and configured to determine whether the longer line segment satisfies a feature of a standard geometric figure, and if the longer line segment satisfies the feature of the standard geometric figure, the boundary range of the liquid crystal panel is determined, and otherwise the boundary line segment selection module is invoked, again.

Second, the present invention provides a panel adsorption device, including: a platform, including a plurality of vacuum adsorption holes, wherein the platform is used to carry a liquid crystal panel; at least one image capture device, disposed above the platform, wherein the image capture device is configured to collect an image of a liquid crystal panel on the platform; a processing device, connected to the image capture device, wherein the processing device receives an image captured by the image capture device, extracts image data, and calculates and determines a boundary range of the liquid crystal panel according to the image data; a vacuum machine, connected to the processing device, wherein the vacuum machine is configured to set a vacuum adsorption hole in the boundary range to a negative pressure state according to the boundary range of the liquid crystal panel determined by the processing device, so that the liquid crystal panel is adsorbed on the platform.

In one embodiment of the present invention, the processing device further includes: a grayscale preprocessing module, configured to perform grayscale processing on the captured image to form a grayscale image; a grayscale image threshold calculation module, connected to the grayscale preprocessing module and configured to segment the grayscale image by using a threshold, wherein a threshold of the grayscale image adopts an adaptive threshold related to an image average grayscale; a closed image forming module, connected to the grayscale image threshold calculation module, and configured to scan the grayscale image, and to determine all boundary points, and to connect the boundary points into a closed figure; a boundary line segment selection module, connected to the closed image forming module, and configured to extract a longer line segment in the closed figure; and a geometric image boundary determination module, connected to the boundary line segment selection module, and configured to determine whether the longer line segment satisfies a feature of a standard geometric figure, and if the longer line segment satisfies the feature of the standard geometric figure, the boundary range of the liquid crystal panel is determined, and otherwise the boundary line segment selection module is invoked, again.

In one embodiment of the present invention, the standard geometric figure is rectangular or diamond shaped.

In one embodiment of the present invention, the image capture device is a camera, and a number of the image capture devices is three, which are respectively disposed above the platform, and an angle between each other on a same spatial plane is 60 degrees.

In one embodiment of the present invention, the device further includes at least one lighting device, installed above the platform, and used to provide a light source to the image capture device to form bright field illumination.

In one embodiment of the present invention, a shooting angle range of the image capture device covers the entire platform.

Moreover, the present invention provides an automatic adsorption method using the aforesaid panel adsorption device, wherein the method includes steps of: (a), placing the liquid crystal panel on the platform including the plurality of vacuum adsorption holes; (b), collecting the image of the liquid crystal panel on the platform by the at least one image capture device, and transferring the captured image to the processing device for the processing device to extract the image data; (c), calculating and determining the boundary range of the liquid crystal panel according to the image data obtained by the processing device; and (d), setting the vacuum adsorption hole in the boundary range to the negative pressure state by the vacuum machine according to the determined boundary range of the liquid crystal panel, so that the liquid crystal panel is adsorbed on the platform.

In one embodiment of the present invention, Step (c) further includes steps of: (c1), performing grayscale processing on the captured image by the processing device to form a grayscale image; (c2), segmenting the grayscale image by using a threshold by the processing device, wherein a threshold of the grayscale image adopts an adaptive threshold related to an image average grayscale; (c3), scanning the grayscale image, and determining all boundary points, and connecting the boundary points into a closed figure by the processing device; (c4), extracting a longer line segment in the closed figure by the processing device; and (c5), determining whether the longer line segment satisfies a feature of a standard geometric figure by the processing device, wherein if the longer line segment satisfies the feature of the standard geometric figure, the boundary range of the liquid crystal panel is determined, and then executing Step (d), otherwise executing Step (c4), again.

In one embodiment of the present invention, the standard geometric figure is rectangular or diamond shaped.

In one embodiment of the present invention, in Step (b), the image capture device is a camera, and a number of the image capture devices is three, which are respectively disposed above the platform, and an angle between each other on a same spatial plane is 60 degrees.

In one embodiment of the present invention, the device further includes at least one lighting device, and in Step (b), the method further includes a step of: using the lighting device to provide a light source to the image capture device to form bright field illumination.

In one embodiment of the present invention, in Step (b), a shooting angle range of the image capture device covers the entire platform.

The benefits of the present invention are: in the panel adsorption device of the present invention, a position of a liquid crystal panel on a platform is determined by providing a plurality of image capture devices above the platform, and then correspondingly sets the vacuum adsorption hole to a negative pressure state to firmly locate the liquid crystal panel on the platform. Meanwhile, the platform can be compatible with panels of various models and sizes. In addition, the panel adsorption device can intelligently open the vacuum adsorption holes covered by the panel according to various types and sizes of panels, thereby preventing all vacuum adsorption holes on the platform from being opened, thereby saving resources.

BRIEF DESCRIPTION OF THE SEVERAL VIEWS OF THE DRAWINGS

In order to more clearly illustrate the embodiments of the present invention, the following figures will be described in the embodiments are briefly introduced. It is obvious that the drawings are merely some embodiments of the present invention, those of ordinary skill in this field can obtain other figures according to these figures without paying the premise.

DESCRIPTION OF SPECIFIC EMBODIMENTS OF THE INVENTION

For better explaining the technical solution and the effect of the present invention, the present invention will be further described in detail with the accompanying drawings in the specific embodiments. It is clear that the described embodiments are merely part of embodiments of the present invention, but not all embodiments. Based on the embodiments of the present invention, all other embodiments to those of skilled in the premise of no creative efforts obtained, should be considered within the scope of protection of the present invention.

The terms "first", "second", "third", etc. (if present) in the specification and claims of the present invention and the foregoing figures are used to distinguish similar objects, and are not necessary used to describe for a particular order or sequence. It should be understood that the objects so described are interchangeable as appropriate. Furthermore, the terms "including" and its any deformations are intended to cover non-exclusive inclusion.

The drawings, which are discussed below, and the various embodiments used to describe the principles of the present invention are intended to be illustrative only and not to limit the scope of the disclosure of the present invention. Those skilled in the art will appreciate that the principles of the present invention can be implemented in any properly arranged system. Exemplary embodiments will be described in detail, and examples of these embodiments are illustrated in the accompanying drawings. Furthermore, a terminal according to an exemplary embodiment will be described in detail with reference to the accompanying drawings. The same reference numerals in the drawings denote the same elements.

The terms used in the description of the present invention are intended to describe a particular embodiment, and are not intended to illustrate the concept of the invention. Expressions used in the singular encompasses the plural form of expression unless the context clearly dictates otherwise. In the present specification, it should be understood that terms such as "including", "having" and "comprising" and like terms are intended to specify the possibility of the presence of disclosed features, numbers, steps, actions, components, parts, or combinations thereof in the description of the present invention, and are not intended to preclude the possibility of the presence or addition of one or more other features, numbers, steps, actions, components, parts or combinations thereof. The same reference numerals in the drawings denote the same parts.

The embodiment of the present invention provides a panel adsorption device and an automatic adsorption method using the same. The detail descriptions are respectively introduced below.

Figure 1:
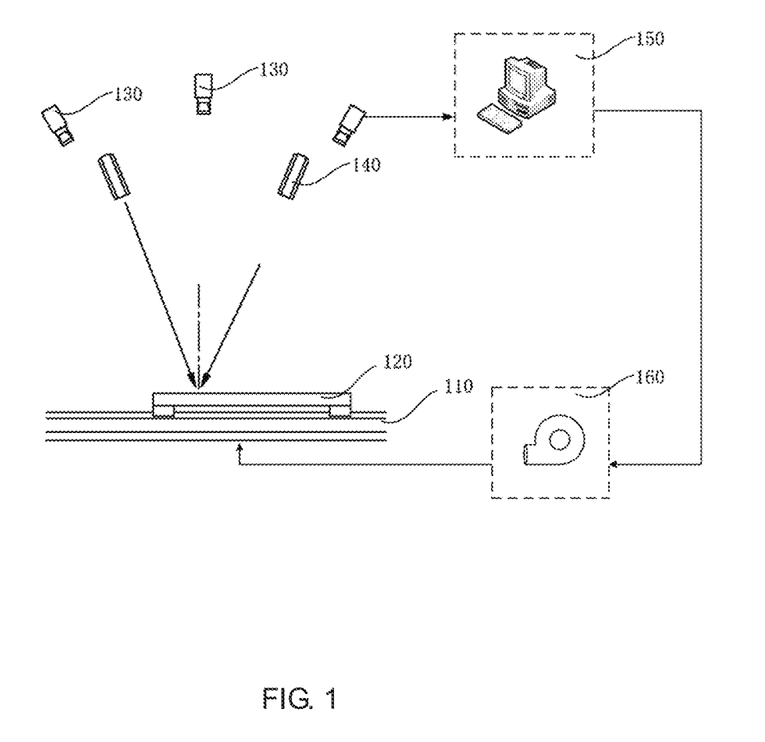
FIG. 1 is a structural diagram of a panel adsorption device in an embodiment of the present invention.
Figure 2:
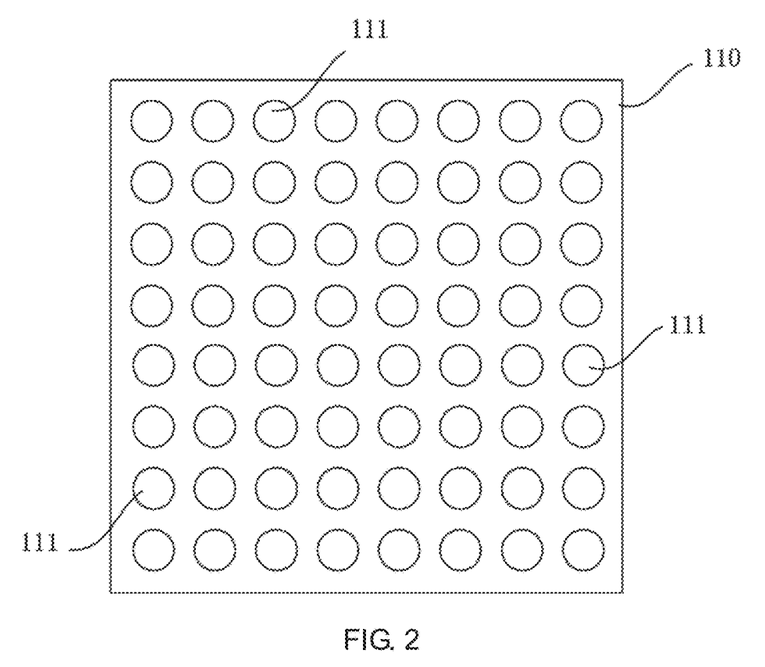
FIG. 2 is a structural diagram of a platform in the embodiment of the present invention.
Figure 3:
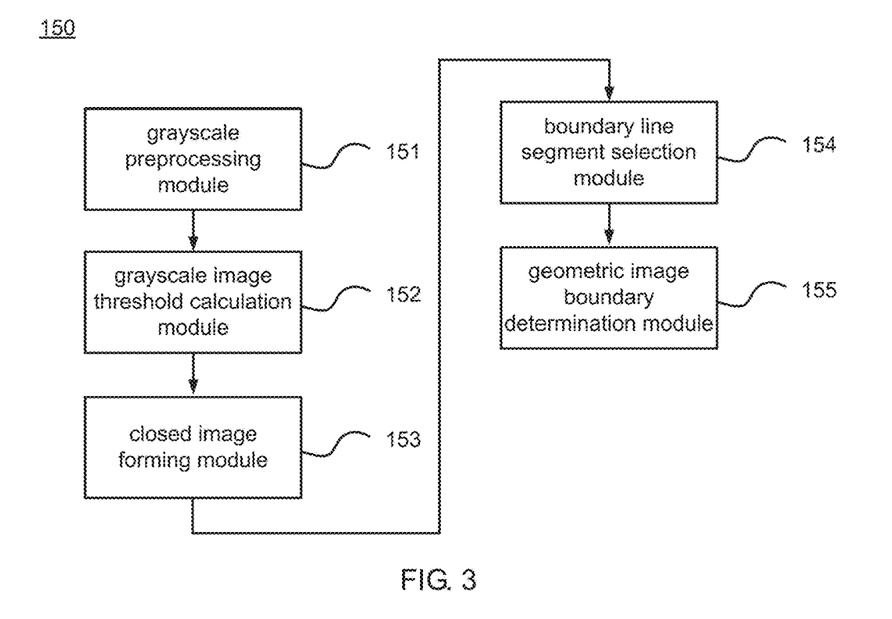
FIG. 3 is a block diagram of a processing device in the embodiment of the present invention.

As shown in FIG. 1 to FIG. 3, in one embodiment of the present invention, a panel adsorption device is provided. The panel adsorption device includes a platform 110, at least one image capture device 130, a processing device 150 and a vacuum machine 160.

The platform 110 includes a plurality of vacuum adsorption holes 111 as shown in FIG. 2. The platform 110 is used to carry a liquid crystal panel. The vacuum adsorption hole 111 may have a diameter of 1 mm and a pitch of 1 cm, but is not limited thereto. By setting the appropriate diameter and pitch of the vacuum adsorption holes 111, the suction force generated by the vacuum machine 160 can be further utilized.

The image capture device 130 is disposed above the platform 110. The image capture device 130 is configured to collect an image of a liquid crystal panel on the platform 110, and to transfer the captured image to the processing device 150 for the processing device 150 to extract the image data.

In this embodiment, the panel adsorption device further includes at least one lighting device 140. The lighting device 140 is installed above the platform 110, and used to provide a light source to the image capture device 130 to form bright field illumination. As the bright field illumination is formed, the image contrast of the liquid crystal panel is enhanced, which is more conducive to improving the accuracy of the determination of the boundary range of the liquid crystal panel.

The image capture device 130 may be an imaging device, such as a camera or a camera having an imaging function. In this embodiment, the image capture device 130 is a camera, and a number of the image capture devices is three, which are respectively disposed above the platform 110, and an angle between each other on a same spatial plane is 60 degrees. Certainly, the number of cameras and the installation position are not limited thereto.

Besides, for ensuring the image effect (and subsequent grayscale processing) captured by the image acquisition device 130, in this embodiment, the installation position of the image capture device 130 needs to satisfy the following conditions, that is, the shooting angle range covers the entire platform 110. If the number of image capture device 130 is one, the shooting angle range of the image capture device 130 covers the entire platform 110. If the number of image capture devices 130 is two, the shooting angle range of each image capture device 130 needs to cover half of the platform 110, and so on. Certainly, it is also an option that the shooting angle range of each image capture device 130 covers the entire platform 110.

The processing device 150 is connected to the image capture device 130. The processing device 150 can be a computer, a single chip microcomputer, a DSP processor or an FPGA, which possesses a computing processing function. The processing device 150 is configured to receive an image captured by the image capture device, extract image data. The image data is extracted according to the image provided by the image capture device 130, and the processing device performs pre-processing (including grayscale processing), calculation analysis, and can determine a boundary range of the liquid crystal panel. Certainly, the processing device 150 may further include a storage device (not shown) for saving the extracted image data, or saving the temporary data generated during the calculation and analysis, or saving the related data that finally determines the boundary range of the liquid crystal panel for an invoke or utilization by other device in advance.

As shown in FIG. 3, in this embodiment, the processing device 150 further includes: a grayscale preprocessing module 151, a grayscale image threshold calculation module 152, a closed image forming module 153, a boundary line segment selection module 154 and a geometric image boundary determination module 155.

The grayscale preprocessing module 151 is configured to perform grayscale processing on the captured image to form a grayscale image. Namely, the image obtained from the image capture device 130 is subjected to preprocessing, such as grayscale processing. Meanwhile, the formed grayscale image can be subjected to noise reduction processing by utilizing the median filtering and mean filtering superposition processing, thereby preventing noise in the grayscale image from affecting the detection of the boundary range of the liquid crystal panel. Certainly, the manner of noise reduction processing is not limited to the foregoing two methods.

The grayscale image threshold calculation module 152 is connected to the grayscale preprocessing module 151. The grayscale image threshold calculation module 152 is configured to segment the grayscale image by using a threshold, wherein a threshold of the grayscale image adopts an adaptive threshold related to an image average grayscale. The adaptive threshold is obtained by experimenting with image data of a large number of on-site liquid crystal panels. The gray image adaptive threshold $T=T0/(1-M/255)$, and M is the average gray level of the image, and T0 is the adaptive threshold coefficient, and T0 is adaptively adjusted with the size of M: when M is less than or equal to 70, T0 is 50, and when M is greater than 70, T0 is 25.

The closed image forming module 153 is connected to the grayscale image threshold calculation module 152. The closed image forming module 153 is configured to scan the grayscale image, and to determine all boundary points, and to connect the boundary points into a closed figure. The determination of the boundary points can be obtained by: the first line of the grayscale image is subjected to line scanning, and is judged according to the calculated threshold T. If the absolute value of the grayscale difference of the adjacent pixels is greater than T, that is, $|Gray(i)-Gray(i+1)|>T$, the coordinate $L(0)$ of the adjacent left point is recorded as the starting point of the first boundary of the grayscale image, and the scanning continues. If the absolute value of the grayscale (Gary) difference between adjacent pixels is greater than T, that is, |Gray(i)−Gray(i+1)|>T, the coordinate R(0) of the adjacent right point is recorded as the starting point of the second boundary of the grayscale image. Then, the left and right starting points of boundary of the grayscale image are determined. Then, the determined left and right starting point positions are saved in an array of left and right boundary positions. Similarly, the last line of the grayscale image is subjected to line scanning. If the absolute value of the grayscale difference of the adjacent pixels is greater than T, that is, |Gray(i)−Gray(i+1)|>T, the coordinate L(H−1) of the adjacent left point is recorded as the first boundary end of the grayscale image, wherein H is the height of the image, and scanning continues. If the absolute value of the grayscale difference of the adjacent pixels is greater than T, that is, |Gray(i)−Gray(i+1)|>T, the coordinate R(H−1) of the adjacent right point is recorded as the second boundary end of the grayscale image. Then, the left and right end points of boundary of the grayscale image are determined. Then, the determined left and right end point positions are saved in an array of left and right boundary positions.

The boundary line segment selection module 154 is connected to the closed image forming module 153. The boundary line segment selection module 154 is configured to extract a longer line segment in the closed figure.

The geometric image boundary determination module 155 is connected to the boundary line segment selection module 154. The geometric image boundary determination module 155 is configured to determine whether the longer line segment satisfies a feature of a standard geometric figure, and if the longer line segment satisfies the feature of the standard geometric figure, the boundary range of the liquid crystal panel is determined, and otherwise the boundary line segment selection module 154 is invoked, again.

In this embodiment, when the standard geometric figure is a rectangle, the four longest line segments can be extracted from the closed figure by invoking the boundary line segment selection module 154. Meanwhile, by invoking the geometric image boundary determination module 155, it can be determined whether the four longer line segments are parallel, and the angle is 90 degrees. If the condition is satisfied, the four longest line segments are considered to be the boundary range of the liquid crystal panel. If the condition is not satisfied, the boundary line segment selection module 154 is re-invoked, and line segments that do not satisfy the condition are discarded. For instance, the four longest line segments are obtained, and the third line segment and the fourth line segment are parallel, and the first line segment and the second line segment are not parallel. However, if the angle between the first line segment and the third line segment and the angle between the first line segment the fourth line segment are 90 degrees, it is determined that the second line segment is to be discarded, and then the new longer line segment is added, and the rectangular shape feature is re-verified.

In another embodiment, when the standard geometric figure is a diamond, the four longest line segments can be extracted from the closed figure by invoking the boundary line segment selection module 154. Meanwhile, by invoking the geometric image boundary determination module 155, it can be determined whether the four longest line segments are parallel, and the angle is an acute angle or an obtuse angle. If the condition is satisfied, the four longest line segments are considered to be the boundary range of the liquid crystal panel. If the condition is not satisfied, the boundary line segment selection module 154 is re-invoked, and line segments that do not satisfy the condition are discarded until the line segments that satisfy the condition are found to determine the boundary range of the liquid crystal panel.

Certainly, the aforesaid embodiments describe only standard geometries, such as rectangles or diamonds. Other standard geometric figures can also obtain the boundary range of the corresponding liquid crystal panel by invoking the closed image forming module 153, the boundary line segment selection module 154 and the geometric image boundary determination module 155, which are similar to the above, and will not be described herein.

The vacuum machine 160 is connected to the processing device 150. The vacuum machine 160 is configured to set a vacuum adsorption hole 111 in the boundary range to a negative pressure state according to the boundary range of the liquid crystal panel determined by the processing device 150, so that the liquid crystal panel is firmly adsorbed on the platform 110.

With the aforementioned structural design of the panel adsorption device, it is possible to realize that the platform 110 can adsorb panels of various models and sizes. In addition, the panel adsorption device can intelligently open the vacuum adsorption holes 111 in the boundary range (i.e. the vacuum adsorption holes covered by the panel) according to various types and sizes of panels, thereby preventing all vacuum adsorption holes 111 on the platform 110 from being opened, thereby saving resources.

Figure 4:
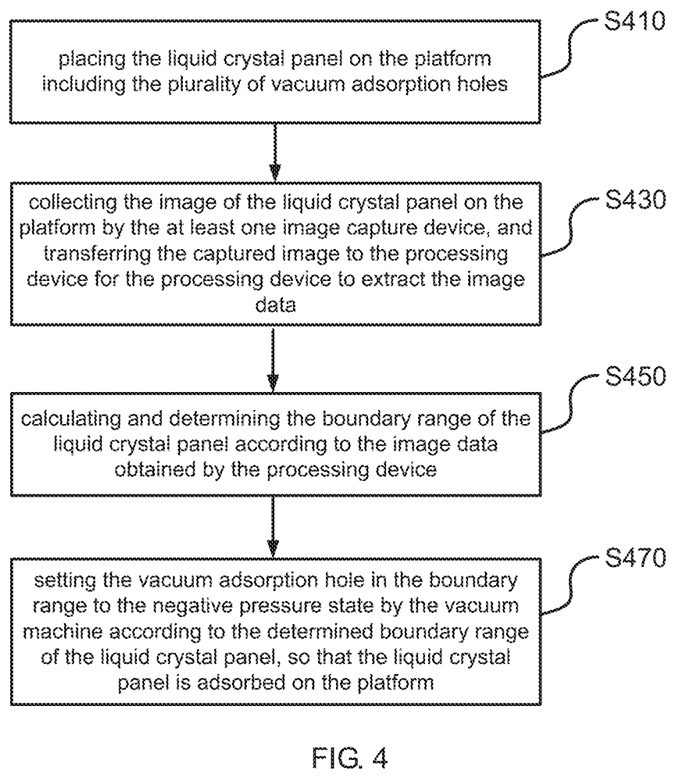
FIG. 4 is a flow chart of steps of an automatic adsorption method using the panel adsorption device in an embodiment of the present invention.
Figure 5:
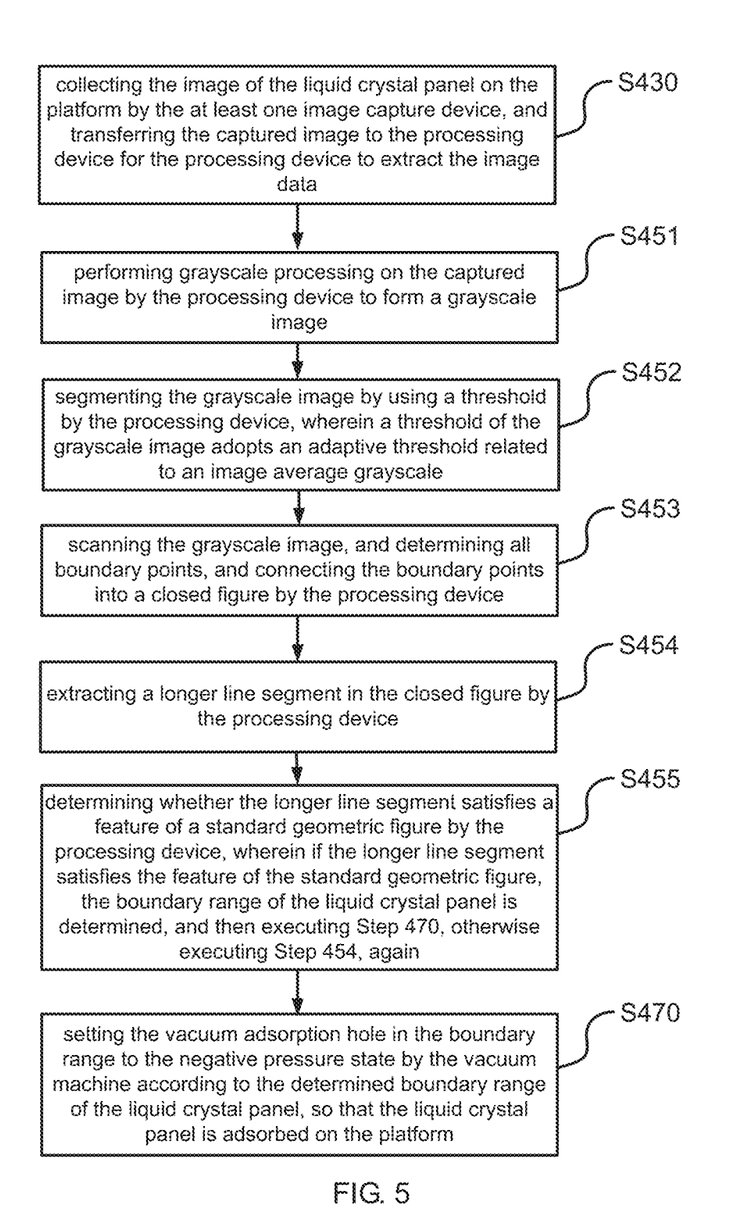
FIG. 5 is a flow chart of sub-steps of step S450 shown in FIG. 4.

Please refer to FIG. 4 and FIG. 5, the present invention further provides an automatic adsorption method using the aforesaid panel adsorption device, wherein the method includes steps of:

Step S410: placing the liquid crystal panel on the platform including the plurality of vacuum adsorption holes.

The platform includes a plurality of vacuum adsorption holes. The platform is used to carry a liquid crystal panel. The vacuum adsorption hole may have a diameter of 1 mm and a pitch of 1 cm, but is not limited thereto.

Step S430: collecting the image of the liquid crystal panel on the platform by the at least one image capture device, and transferring the captured image to the processing device for the processing device to extract the image data.

In Step S430, the image capture device is a camera, and a number of the image capture devices is three, which are respectively disposed above the platform, and an angle between each other on a same spatial plane is 60 degrees. Certainly, the number of cameras and the installation position are not limited thereto. For ensuring the image effect (and subsequent grayscale processing) captured by the image acquisition device, in this embodiment, the installation position of the image capture device needs to satisfy the following conditions, that is, the shooting angle range covers the entire platform. If the number of image capture device is one, the shooting angle range of the image capture device covers the entire platform. If the number of image capture devices is two, the shooting angle range of each image capture device needs to cover half of the platform, and so on. Certainly, it is also an option that the shooting angle range of each image capture device covers the entire platform.

In addition, Step S430 further includes: using the lighting device to provide a light source to the image capture device to form bright field illumination. Thus, as the bright field illumination is formed, the image contrast of the liquid crystal panel is enhanced, which is more conducive to improving the accuracy of the determination of the boundary range of the liquid crystal panel.

Step S450: calculating and determining the boundary range of the liquid crystal panel according to the image data obtained by the processing device.

In this step, the method further includes steps of:

Step S451: performing grayscale processing on the captured image by the processing device to form a grayscale image.

The image obtained from the image capture device is subjected to preprocessing, such as grayscale processing. Meanwhile, the formed grayscale image can be subjected to noise reduction processing by utilizing the median filtering and mean filtering superposition processing, thereby preventing noise in the grayscale image from affecting the detection of the boundary range of the liquid crystal panel. Certainly, the manner of noise reduction processing is not limited to the foregoing two methods.

Step S452: segmenting the grayscale image by using a threshold by the processing device, wherein a threshold of the grayscale image adopts an adaptive threshold related to an image average grayscale.

The grayscale image is segmented by using the threshold by the processing device, wherein the threshold of the grayscale image adopts the adaptive threshold related to the image average grayscale. The adaptive threshold is obtained by experimenting with image data of a large number of on-site liquid crystal panels. The gray image adaptive threshold $T=T0/(1-M/255)$, and M is the average gray level of the image, and T0 is the adaptive threshold coefficient, and T0 is adaptively adjusted with the size of M: when M is less than or equal to 70, T0 is 50, and when M is greater than 70, T0 is 25.

Step S453: scanning the grayscale image, and determining all boundary points, and connecting the boundary points into a closed figure by the processing device.

The grayscale image is scanned, and all boundary points are determined, and these boundary points are connected into a closed figure. The determination of the boundary points can be obtained by: the first line of the grayscale image is subjected to line scanning, and is judged according to the calculated threshold T. If the absolute value of the grayscale difference of the adjacent pixels is greater than T, that is, $|Gray(i)-Gray(i+1)|>T$, the coordinate L(0) of the adjacent left point is recorded as the starting point of the first boundary of the grayscale image, and the scanning continues. If the absolute value of the grayscale (Gary) difference between adjacent pixels is greater than T, that is, $|Gray(i)-Gray(i+1)|>T$, the coordinate R(0) of the adjacent right point is recorded as the starting point of the second boundary of the grayscale image. Then, the left and right starting points of boundary of the grayscale image are determined. Then, the determined left and right starting point positions are saved in an array of left and right boundary positions. Similarly, the last line of the grayscale image is subjected to line scanning. If the absolute value of the grayscale difference of the adjacent pixels is greater than T, that is, $|Gray(i)-Gray(i+1)|>T$, the coordinate L(H−1) of the adjacent left point is recorded as the first boundary end of the grayscale image, wherein H is the height of the image, and scanning continues. If the absolute value of the grayscale difference of the adjacent pixels is greater than T, that is, $|Gray(i)-Gray(i+1)|>T$, the coordinate R(H−1) of the adjacent right point is recorded as the second boundary end of the grayscale image. Then, the left and right end points of boundary of the grayscale image are determined. Then, the determined left and right end point positions are saved in an array of left and right boundary positions.

Step S454: extracting a longer line segment in the closed figure by the processing device.

Step S455: determining whether the longer line segment satisfies a feature of a standard geometric figure by the processing device, wherein if the longer line segment satisfies the feature of the standard geometric figure, the boundary range of the liquid crystal panel is determined, and then executing Step 470, otherwise executing Step 454, again.

In this embodiment, when the standard geometric figure is a rectangle, the four longest line segments is extracted from the closed figure via Step S454. Via Step S454, it can be determined whether the four longer line segments are parallel, and the angle is 90 degrees. If the condition is satisfied, the four longest line segments are considered to be the boundary range of the liquid crystal panel, and Step S470 is executed. If the condition is not satisfied, Step S454 is re-executed, and line segments that do not satisfy the condition are discarded. For instance, the four longest line segments are obtained, and the third line segment and the fourth line segment are parallel, and the first line segment and the second line segment are not parallel. However, if the angle between the first line segment and the third line segment and the angle between the first line segment the fourth line segment are 90 degrees, it is determined that the second line segment is to be discarded, and then the new longer line segment is added, and the rectangular shape feature is re-verified until the line segments that satisfy the condition are found to determine the boundary range of the liquid crystal panel.

Step S470: setting the vacuum adsorption hole in the boundary range to the negative pressure state by the vacuum machine according to the determined boundary range of the liquid crystal panel, so that the liquid crystal panel is adsorbed on the platform.

The vacuum machine sets the vacuum adsorption hole in the boundary range to the negative pressure state according to the determined boundary range of the liquid crystal panel, so that the liquid crystal panel is firmly adsorbed on the platform.

With the aforementioned implementation of Step S410 to Step 470, it is possible to realize that the platform can adsorb panels of various models and sizes. In addition, the panel adsorption device can intelligently open the vacuum adsorption holes in the boundary range (i.e. the vacuum adsorption holes covered by the panel) according to various types and sizes of panels, thereby preventing all vacuum adsorption holes on the platform from being opened, thereby saving resources.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

The subject matter of the present application can be manufactured and used in the industry with industrial applicability.

What is claimed is:

1. A panel adsorption device, including:
    a platform, including a plurality of vacuum adsorption holes, wherein the platform is used to carry a liquid crystal panel;
    at least one image capture device, disposed above the platform, wherein the image capture device is configured to collect an image of a liquid crystal panel on the platform;

a processing device, connected to the image capture device, wherein the processing device receives an image captured by the image capture device, extracts image data, and calculates and determines a boundary range of the liquid crystal panel according to the image data;

a vacuum machine, connected to the processing device, wherein the vacuum machine is configured to set a vacuum adsorption hole in the boundary range to a negative pressure state according to the boundary range of the liquid crystal panel determined by the processing device, so that the liquid crystal panel is adsorbed on the platform;

at least one lighting device, installed above the platform, and used to provide a light source to the image capture device to form bright field illumination;

wherein the processing device further includes:

a grayscale preprocessing module, configured to perform grayscale processing on the captured image to form a grayscale image;

a grayscale image threshold calculation module, connected to the grayscale preprocessing module and configured to segment the grayscale image by using a threshold, wherein a threshold of the grayscale image adopts an adaptive threshold related to an image average grayscale;

a closed image forming module, connected to the grayscale image threshold calculation module, and configured to scan the grayscale image, and to determine all boundary points, and to connect the boundary points into a closed figure;

a boundary line segment selection module, connected to the closed image forming module, and configured to extract a longer line segment in the closed figure; and a geometric image boundary determination module, connected to the boundary line segment selection module, and configured to determine whether the longer line segment satisfies a feature of a standard geometric figure, and if the longer line segment satisfies the feature of the standard geometric figure, the boundary range of the liquid crystal panel is determined, and otherwise the boundary line segment selection module is invoked, again.

2. A panel adsorption device, including:

a platform, including a plurality of vacuum adsorption holes, wherein the platform is used to carry a liquid crystal panel;

at least one image capture device, disposed above the platform, wherein the image capture device is configured to collect an image of a liquid crystal panel on the platform;

a processing device, connected to the image capture device, wherein the processing device receives an image captured by the image capture device, extracts image data, and calculates and determines a boundary range of the liquid crystal panel according to the image data;

a vacuum machine, connected to the processing device, wherein the vacuum machine is configured to set a vacuum adsorption hole in the boundary range to a negative pressure state according to the boundary range of the liquid crystal panel determined by the processing device, so that the liquid crystal panel is adsorbed on the platform.

3. The panel adsorption device according to claim 2, wherein the processing device further includes:

a grayscale preprocessing module, configured to perform grayscale processing on the captured image to form a grayscale image;

a grayscale image threshold calculation module, connected to the grayscale preprocessing module and configured to segment the grayscale image by using a threshold, wherein a threshold of the grayscale image adopts an adaptive threshold related to an image average grayscale;

a closed image forming module, connected to the grayscale image threshold calculation module, and configured to scan the grayscale image, and to determine all boundary points, and to connect the boundary points into a closed figure;

a boundary line segment selection module, connected to the closed image forming module, and configured to extract a longer line segment in the closed figure; and a geometric image boundary determination module, connected to the boundary line segment selection module, and configured to determine whether the longer line segment satisfies a feature of a standard geometric figure, and if the longer line segment satisfies the feature of the standard geometric figure, the boundary range of the liquid crystal panel is determined, and otherwise the boundary line segment selection module is invoked, again.

4. The panel adsorption device according to claim 3, wherein the standard geometric figure is rectangular or diamond shaped.

5. The panel adsorption device according to claim 2, wherein the image capture device is a camera, and a number of the image capture devices is three, which are respectively disposed above the platform, and an angle between each other on a same spatial plane is 60 degrees.

6. The panel adsorption device according to claim 2, wherein the device further includes at least one lighting device, installed above the platform, and used to provide a light source to the image capture device to form bright field illumination.

7. The panel adsorption device according to claim 2, wherein a shooting angle range of the image capture device covers the entire platform.

8. An automatic adsorption method using the panel adsorption device according to claim 2, wherein the method includes steps of:

(a), placing the liquid crystal panel on the platform including the plurality of vacuum adsorption holes;

(b), collecting the image of the liquid crystal panel on the platform by the at least one image capture device, and transferring the captured image to the processing device for the processing device to extract the image data;

(c), calculating and determining the boundary range of the liquid crystal panel according to the image data obtained by the processing device; and (d), setting the vacuum adsorption hole in the boundary range to the negative pressure state by the vacuum machine according to the determined boundary range of the liquid crystal panel, so that the liquid crystal panel is adsorbed on the platform.

9. The automatic adsorption method according to claim 8, wherein Step (c) further includes:

(c1), performing grayscale processing on the captured image by the processing device to form a grayscale image;

(c2), segmenting the grayscale image by using a threshold by the processing device, wherein a threshold of the grayscale image adopts an adaptive threshold related to an image average grayscale;

(c3), scanning the grayscale image, and determining all boundary points, and connecting the boundary points into a closed figure by the processing device;

(c4), extracting a longer line segment in the closed figure by the processing device; and (c5), determining whether the longer line segment satisfies a feature of a standard geometric figure by the processing device, wherein if the longer line segment satisfies the feature of the standard geometric figure, the boundary range of the liquid crystal panel is determined, and then executing Step (d), otherwise executing Step (c4), again.

10. The automatic adsorption method according to claim 8, wherein the standard geometric figure is rectangular or diamond shaped.

11. The automatic adsorption method according to claim 8, wherein in Step (b), the image capture device is a camera, and a number of the image capture devices is three, which are respectively disposed above the platform, and an angle between each other on a same spatial plane is 60 degrees.

12. The automatic adsorption method according to claim 8, wherein the device further includes at least one lighting device, and in Step (b), the method further includes a step of: using the lighting device to provide a light source to the image capture device to form bright field illumination.

13. The automatic adsorption method according to claim 8, wherein in Step (b), a shooting angle range of the image capture device covers the entire platform.

* * * * *